(12) United States Patent
Ito

(10) Patent No.: US 9,524,177 B2
(45) Date of Patent: Dec. 20, 2016

(54) INFORMATION PROCESSING APPARATUS, METHOD FOR CONTROLLING INFORMATION PROCESSING APPARATUS, AND STORAGE MEDIUM

(71) Applicant: CANON KABUSHIKI KAISHA, Tokyo (JP)

(72) Inventor: Hiroki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 235 days.

(21) Appl. No.: 13/925,671

(22) Filed: Jun. 24, 2013

(65) Prior Publication Data
US 2014/0006766 A1     Jan. 2, 2014

(30) Foreign Application Priority Data

Jun. 28, 2012   (JP) .................................. 2012-145659

(51) Int. Cl.
| | | |
|---|---|---|
| G06F 9/445 | (2006.01) | |
| G06F 9/44 | (2006.01) | |
| H04N 1/00 | (2006.01) | |
| H04N 1/32 | (2006.01) | |
| G06F 17/50 | (2006.01) | |

(52) U.S. Cl.
CPC ......... *G06F 9/44505* (2013.01); *G06F 9/4406* (2013.01); *G06F 17/5054* (2013.01); *H04N 1/0097* (2013.01); *H04N 1/00938* (2013.01); *H04N 1/32571* (2013.01)

(58) Field of Classification Search
None
See application file for complete search history.

(56) References Cited

U.S. PATENT DOCUMENTS

| | | | |
|---|---|---|---|
| 6,021,490 | A | 2/2000 | Vorbach |
| 7,470,902 | B1 | 12/2008 | Kraemer |
| 2002/0054304 | A1 | 5/2002 | Kamei |
| 2007/0208926 | A1 | 9/2007 | Grieve |
| 2008/0059777 | A1 | 3/2008 | Miyake |
| 2011/0099423 | A1 | 4/2011 | Chen |
| 2011/0109931 | A1 | 5/2011 | Nomura |

FOREIGN PATENT DOCUMENTS

| | | |
|---|---|---|
| CN | 1540534 A | 10/2004 |
| CN | 1991611 A | 7/2007 |
| GB | 2423840 A | 9/2006 |
| JP | 2004-210506 A | 7/2004 |

*Primary Examiner* — Kim Huynh
*Assistant Examiner* — Vincent Chang
(74) *Attorney, Agent, or Firm* — Canon U.S.A., Inc. IP Division

(57) ABSTRACT

An information processing apparatus includes a control unit, a processing unit capable of dynamically changing a circuit configuration thereof, and a storage unit configured to store circuit information indicating a circuit configuration to be read into the processing unit, wherein the processing unit reads first circuit information from the storage unit to function as a storage medium for storing a program, and wherein the control unit reads the program from the processing unit to execute the program.

9 Claims, 8 Drawing Sheets

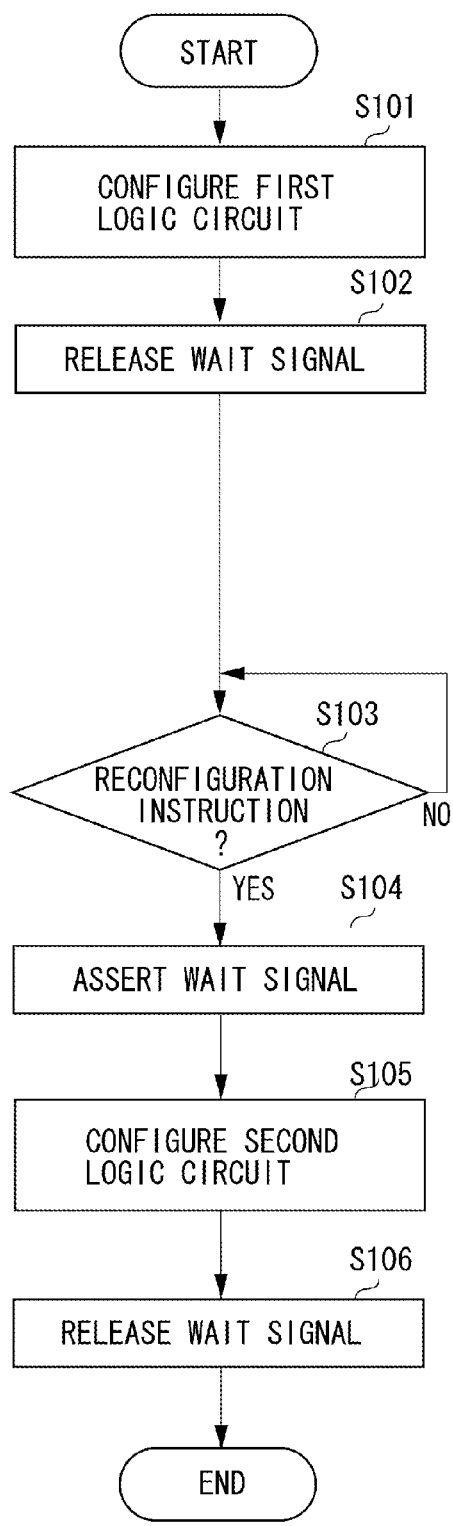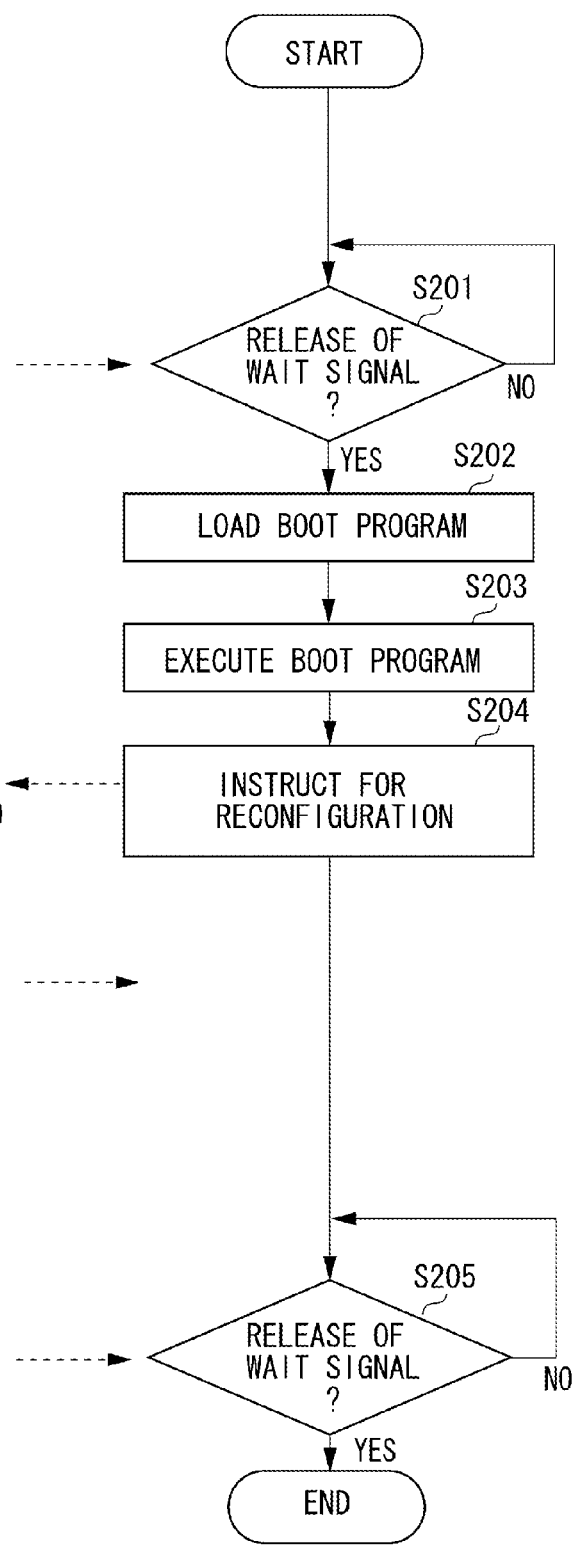

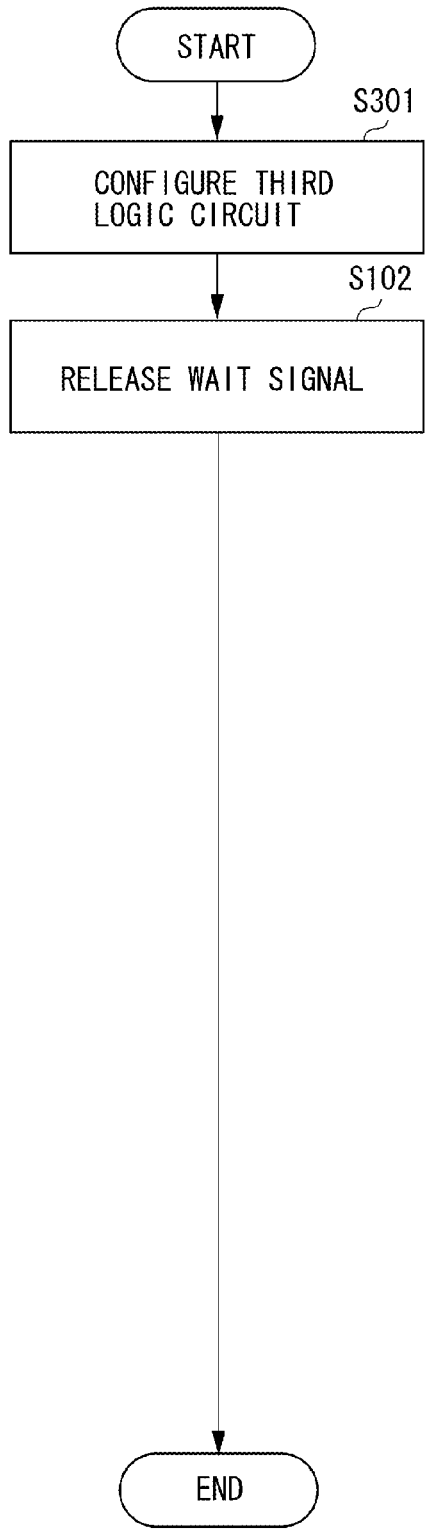
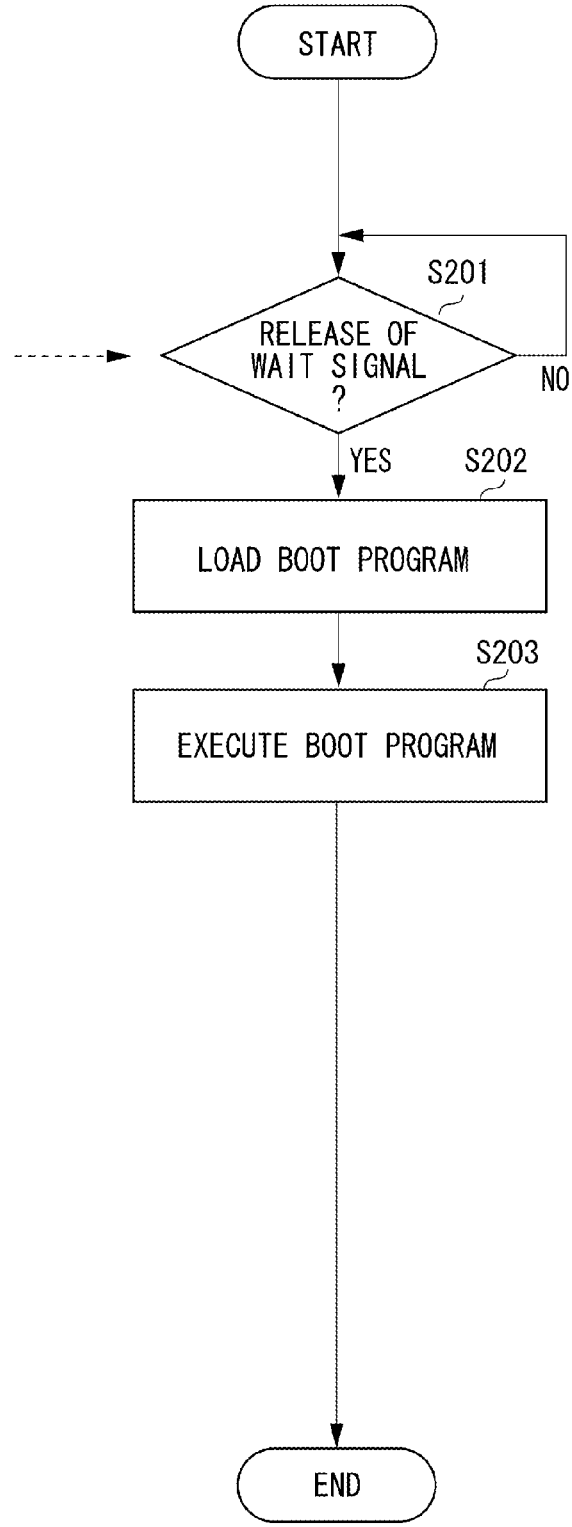

INFORMATION PROCESSING APPARATUS, METHOD FOR CONTROLLING INFORMATION PROCESSING APPARATUS, AND STORAGE MEDIUM

BACKGROUND OF THE INVENTION

Field of the Invention

The present invention relates to an information processing apparatus, a method for controlling an information processing apparatus, and a storage medium.

Description of the Related Art

Recently, in place of an application specific integrated circuit (ASIC), a programmable logic device (PLD) has often been used in an information processing apparatus. The ASIC is an integrated circuit customized for a particular application, and the role of a given device is fixed. On the other hand, with the PLD, a logic circuit can be configured as desired by changing a program to be loaded thereinto, and thus the role of a given device can be dynamically changed. An example of often used PLDs is a field programmable gate array (FPGA).

In an apparatus that includes a central processing unit (CPU) and an FPGA, typically, a read-only memory (ROM) that stores a boot program for the CPU is provided separately from a flash ROM that stores circuit information to be used in the FPGA (see, for example, Japanese Patent Application Laid-Open No. 2004-210506).

However, preparing distinct storage media for the CPU and the FPGA disadvantageously leads to an increase in the cost of the components or in the scale of the circuit. In particular, a ROM that stores a boot program for the CPU tends to be small in capacity, and is typically used only at startup, and thus it is desirable not to provide a separate ROM for the CPU.

SUMMARY OF THE INVENTION

The present invention is directed to an information processing apparatus including a CPU and an FPGA capable of avoiding to provide a separate ROM for storing a boot program for the CPU.

Further features of the present invention will become apparent from the following description of exemplary embodiments with reference to the attached drawings.

BRIEF DESCRIPTION OF THE DRAWINGS

FIGS. 5A and 5B are flowcharts illustrating operations of a controller unit when an image forming apparatus is started according to the first exemplary embodiment.

FIGS. 8A and 8B are flowcharts illustrating operations of a controller unit when an image forming apparatus is started according to the second exemplary embodiment.

DESCRIPTION OF THE EMBODIMENTS

Hereinafter, exemplary embodiments of the present invention will be described in detail with reference to the drawings.

In the following description, an image forming apparatus such as a printer will be described as an example of an information processing apparatus, but the exemplary embodiments of the present invention may be applied to various information apparatuses such as a personal computer (PC). Further, a multifunction peripheral having a scanner function, a printer function, and a FAX function will be described as the image forming apparatus, but the exemplary embodiments of the present invention may be applied to an apparatus that has at least one of the aforementioned functions.

According to a first exemplary embodiment, in an image forming apparatus that includes an FPGA, the FPGA functions as a ROM for a boot program at startup and as a circuit for processing image data after startup.

Figure 1:
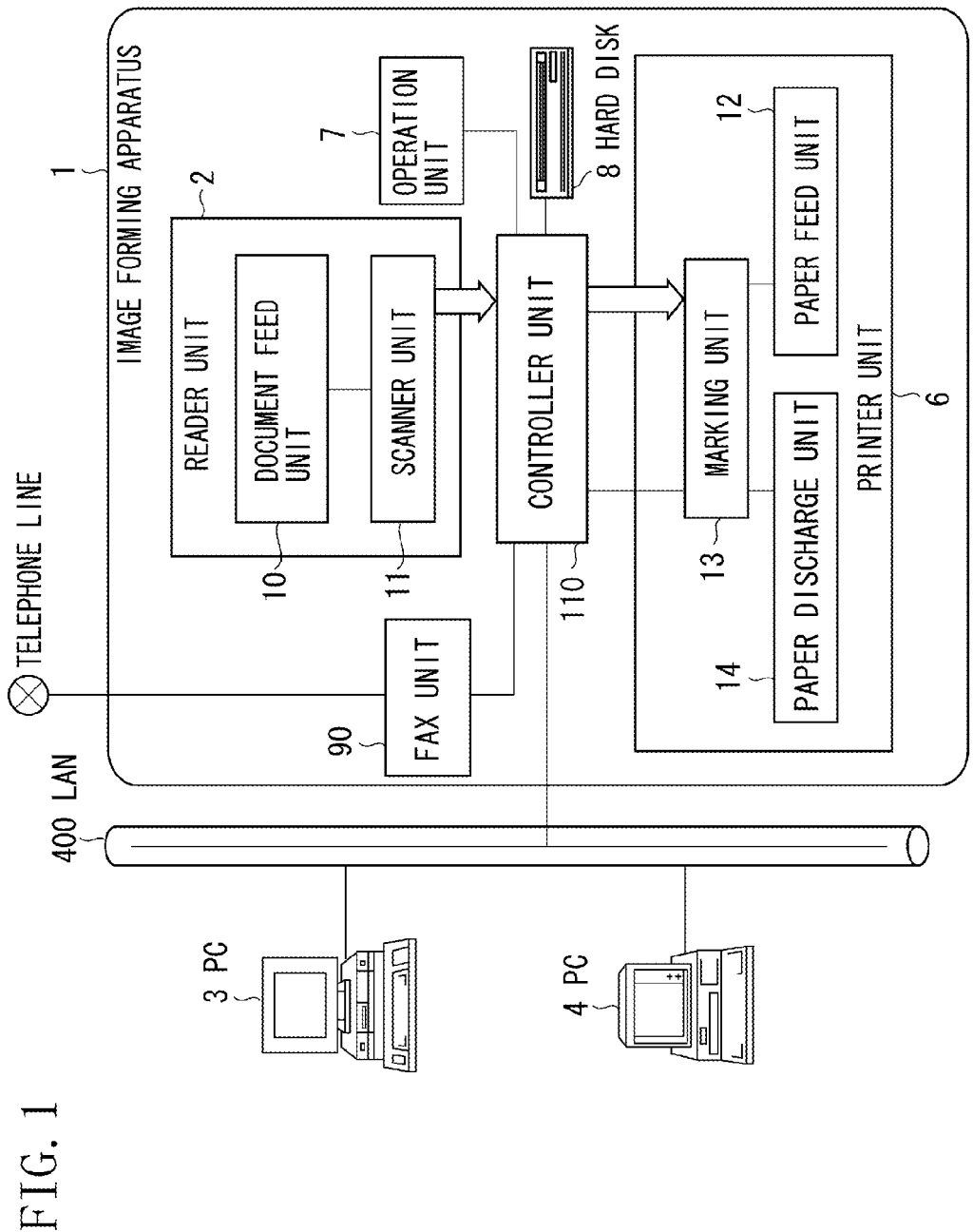
FIG. 1 is a block diagram illustrating a configuration of an image forming apparatus.

FIG. 1 is a block diagram illustrating a configuration of an image forming apparatus.

An image forming apparatus 1 is connected to a PC 3 and a PC 4 through a LAN 400.

The image forming apparatus 1 includes a reader unit 2, a printer unit 6, an operation unit 7, a hard disk 8, a FAX unit 90, and a controller unit 110.

The reader unit 2 reads a document to take in image data. The reader unit 2 includes a document feed unit 10 and a scanner unit 11. The document feed unit 10 feeds a document. The scanner unit 11 optically reads the fed document and converts the resultant into image data in the form of an electrical signal.

The printer unit 6 carries out printing on a sheet based on the image data. Specifically, the printer unit 6 carries out printing based on data that has been subjected to image processing by an FPGA 102 (described below). The printer unit 6 includes a paper feed unit 12, a marking unit 13, and a paper discharge unit 14. The paper feed unit 12 includes a plurality of paper feed cassettes to hold recording sheets. The marking unit 13 transfers and fixes image data onto a recording sheet. The paper discharge unit 14 performs sort processing and staple processing on printed recording sheets, and then discharges the recording sheets out of the printer unit 6.

The operation unit 7 receives various instructions from a user through a key. In addition, the operation unit 7 notifies a user of various pieces of information through a panel.

The hard disk 8 stores a control program, image data, and so on.

The FAX unit 90 carries out input/output processing of a facsimile.

The controller unit 110 is connected to various constituent elements such as the reader unit 2, the printer unit 6, the operation unit 7, the hard disk 8, and the FAX unit 90 and controls these constituent elements.

Figure 2:
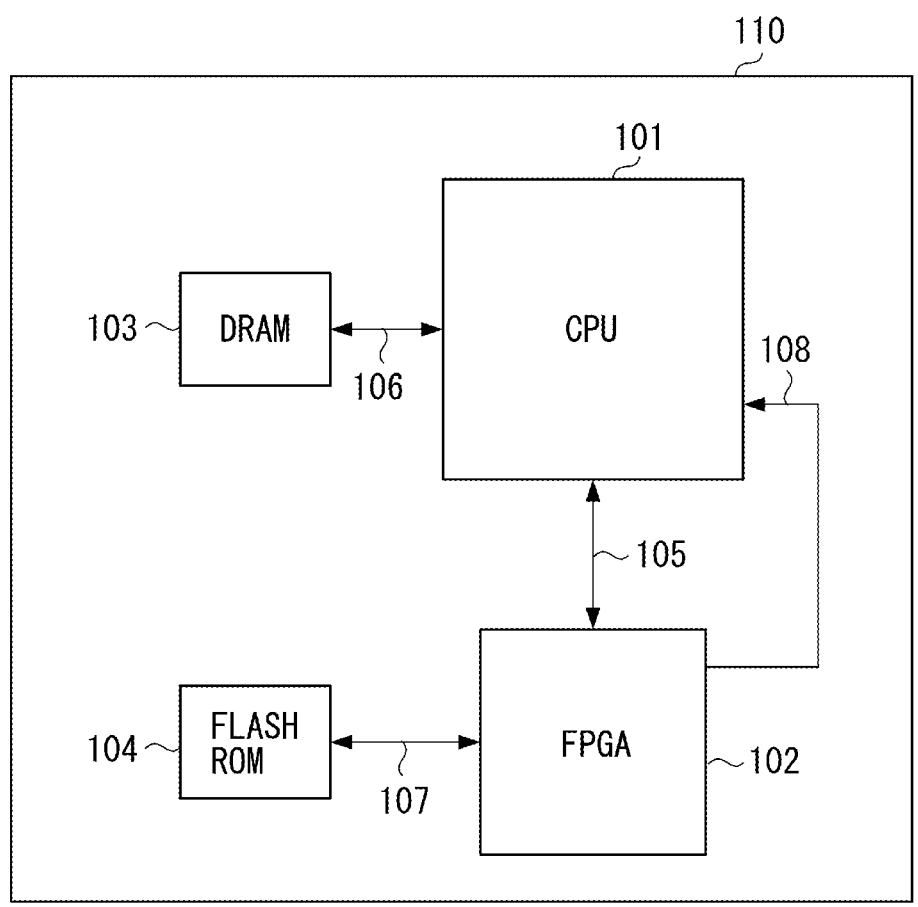
FIG. 2 is a block diagram illustrating a configuration of a controller unit.

FIG. 2 is a block diagram illustrating a configuration of the controller unit 110. FIG. 2 selectively illustrates, among the configuration of the controller unit 110, components that are particularly related to the exemplary embodiments of the present invention, and the controller unit 110 includes various other components than those illustrated in FIG. 2.

A CPU 101 integrally controls the image forming apparatus 1.

The FPGA 102 is a type of PLD in which a logic circuit can be configured and modified as desired within a device. Although an FPGA is cited as an example of a PLD in the present exemplary embodiment, another type of PLD may be used instead.

A dynamic random-access memory (DRAM) 103 is used as a region in which the CPU 101 executes a program.

A flash ROM 104 stores various circuit configurations used in the FPGA 102. Although a flash ROM is cited as an example of a ROM in the present exemplary embodiment, another type of ROM such as an electrically erasable programmable ROM (EPPROM) may be used instead.

A CPU bus 105 connects the CPU 101 with the FPGA 102.

A DRAM interface (I/F) 106 connects the CPU 101 with the DRAM 103.

A serial peripheral interface (SPI) bus 107 connects the FPGA 102 with the flash ROM 104 in a state where the FPGA 102 serves as a master device and the flash ROM 104 serves as a slave device.

The FPGA 102 transmits a wait signal 108 to the CPU 101. The wait signal 108 is in an asserted state so that the CPU 101 is in a wait state as a default.

Figure 3:
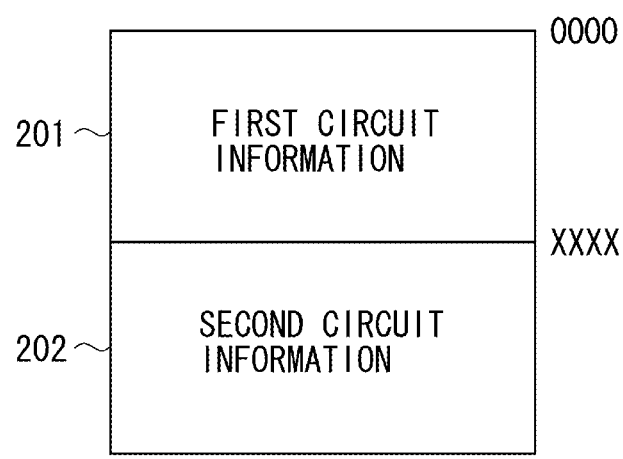
FIG. 3 is a diagram illustrating a data structure of a flash ROM according to a first exemplary embodiment of the present invention.

FIG. 3 is a diagram illustrating a data structure of the flash ROM 104 according to the first exemplary embodiment.

Figure 4A:
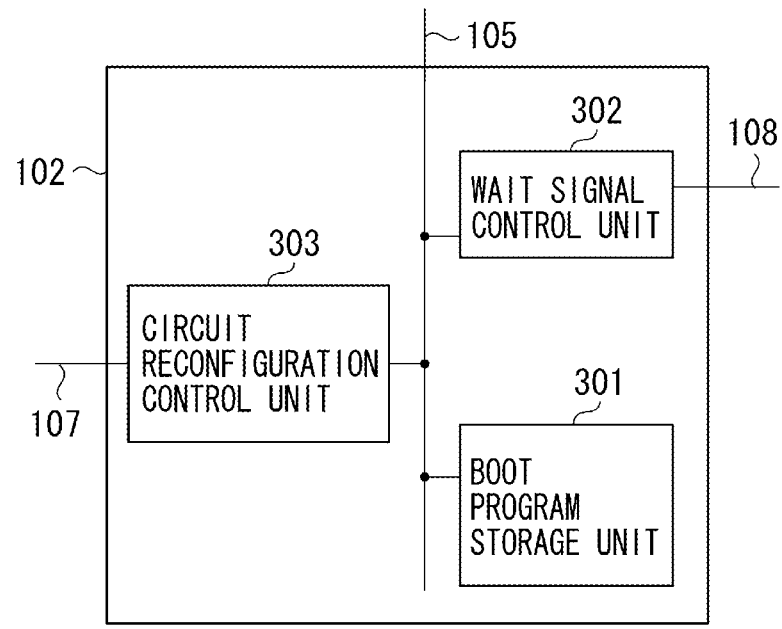
FIGS. 4A and 4B are diagrams each illustrating a logic circuit configured in an FPGA according to the first exemplary embodiment.

First circuit information 201 is data for configuring, in the FPGA 102, a first logic circuit illustrated in FIG. 4A. The first circuit information 201 is written in the flash ROM 104 at an address "0000".

Figure 4B:
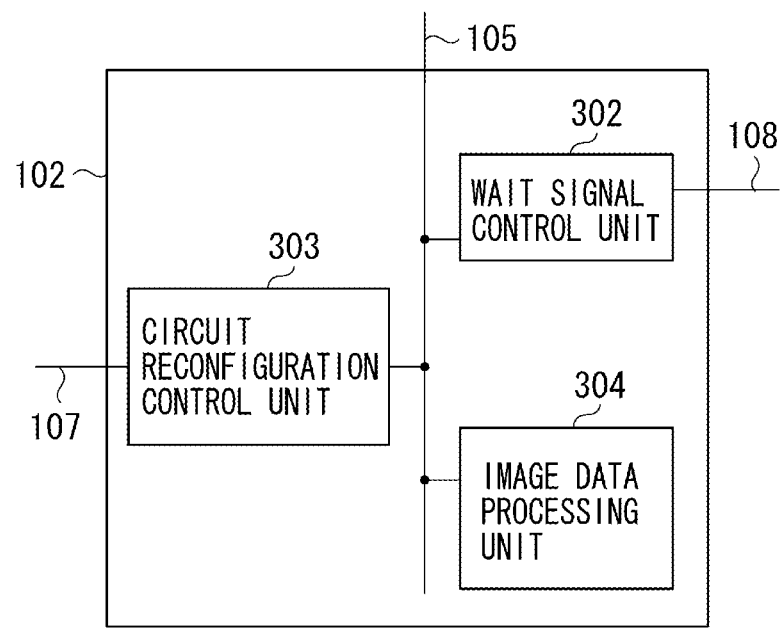

Second circuit information 202 is data for configuring, in the FPGA 102, a second logic circuit illustrated in FIG. 4B. The second circuit information 202 is written in the flash ROM 104 at an address "XXXX" (i.e., an address other than "0000").

FIGS. 4A and 4B are diagrams each illustrating a logic circuit configured in the FPGA 102 according to the first exemplary embodiment.

FIG. 4A is a diagram illustrating the first logic circuit configured in the FPGA 102 by loading the first circuit information 201 into the FPGA 102. The first logic circuit is configured in the FPGA 102 when the image forming apparatus 1 is started, and causes the FPGA 102 to function as a storage medium for storing a boot program for the CPU 101. In FIGS. 4A and 4B, a circuit reconfiguration control unit 303 is a static configuration. That is, the circuit reconfiguration control unit 303 is fixed in advance and cannot be modified by loading a program to be described later. On the other hand, components other than the circuit reconfiguration control unit 303 are dynamic configurations. That is, those components are not fixed in advance and can be modified by loading a program to be described later.

A boot program storage unit 301 stores a boot program which the CPU 101 executes at startup.

A wait signal control unit 302 controls a wait signal 108 to be transmitted from the FPGA 102 to the CPU 101.

The circuit reconfiguration control unit 303 reconfigures a logic circuit within the FPGA 102 in accordance with circuit information notified by the CPU 101 (i.e., circuit information that is written in the flash ROM 104). The circuit reconfiguration control unit 303 automatically loads into the FPGA 102 circuit information that is written at the address "0000" in the flash ROM 104 even if the circuit reconfiguration control unit 303 does not receive an instruction from the CPU 101 when the image forming apparatus 1 is started. In addition, the circuit reconfiguration control unit 303 may control a port connected to the SPI bus 107 so that signals output from the FPGA 102 and the CPU 101 do not collide with each other.

FIG. 4B is a diagram illustrating the second logic circuit configured in the FPGA 102 by loading the second circuit information 202 into the FPGA 102. The logic circuit illustrated in FIG. 4B is configured in the FPGA 102 after the image forming apparatus 1 has been started, and causes the FPGA 102 to function as an image processing circuit to process various pieces of image data.

In FIG. 4B, parts similar to those in FIG. 4A are given the same reference numerals, and the descriptions thereof will be omitted. The configuration in FIG. 4B differs from that in FIG. 4A in that the boot program storage unit 301 is changed to an image data processing unit 304.

The image data processing unit 304 performs various image processing on image data such as shading correction, halftone processing, and smoothing processing. The image data processing unit 304 may carry out processing on data other than image data. Further, in place of the image data processing unit 304, another processing unit that carries out processing other than image processing may be provided. Furthermore, the number of processing units may be more than one.

FIGS. 5A and 5B are flowcharts illustrating operations of the controller unit 110 when the image forming apparatus 1 is started according to the present exemplary embodiment.

The operations illustrated in FIGS. 5A and 5B start as a power supply switch (not illustrated) of the image forming apparatus 1 is turned on.

FIG. 5A is a flowchart illustrating an operation of the FPGA 102 when the image forming apparatus 1 is started.

The operation illustrated in FIG. 5A is realized by the FPGA 102 loading a program from the flash ROM 104 and executing the program.

In step S101, the FPGA 102 reads the first circuit information 201 from the flash ROM 104 at address "0000" through the circuit reconfiguration control unit 303 and configures the first logic circuit as illustrated in FIG. 4A.

In step S102, the FPGA 102 releases a wait signal 108 to the CPU 101 through the wait signal control unit 302 and notifies the CPU 101 of the start of startup processing.

In step S103, the FPGA 102 waits for a reconfiguration instruction which the CPU 101 transmits after the CPU 101 finishes the startup processing (NO in step S103). Here, a reconfiguration instruction includes an instruction for reconfiguration as well as information on an address "XXXX" of the second circuit information 202 for reconfiguration. Upon receiving a reconfiguration instruction (YES in step S103), the processing proceeds to step S104.

In step S104, the FPGA 102 asserts a wait signal 108 to the CPU 101 through the wait signal control unit 302 and puts the CPU 101 into a wait state (i.e., a state where the operation is limited or is not allowed).

In step S105, the FPGA 102 reads the second circuit information 202 from the flash ROM 104 at the address "XXXX" through the circuit reconfiguration control unit 303 and reconfigures in the FPGA 102 the second logic circuit as illustrated in FIG. 4B. At this timing, a port setting in the FPGA 102 may also be performed. In this way, a circuit configuration is reconfigured from the first logic circuit to the second logic circuit because the boot program storage unit 301 becomes unnecessary once booting is completed, and instead the image data processing unit 304 becomes necessary thereafter for image processing.

In step S106, the FPGA 102 releases a wait signal 108 to the CPU 101 through the wait signal control unit 302, and notifies the CPU 101 of the end of the startup processing.

FIG. 5B is a flowchart illustrating an operation of the CPU 101 when the image forming apparatus 1 is started.

The operation in FIG. 5B is realized when the CPU 101 loads a program from the hard disk 8 or the FPGA 102, which is in the circuit configuration illustrated in FIG. 4A, and executes the program.

In step S201, the CPU 101 waits for a wait signal 108 output from the FPGA 102 to be released (NO in step S201). If the wait signal 108 is released (YES in step S201), the processing proceeds to step S202.

In step S202, the CPU 101 reads a boot program from the boot program storage unit 301 of the FPGA 102.

In step S203, the CPU 101 loads the program read in step S202 onto the DRAM 103 and execute the loaded program, thereby carrying out boot processing.

In step S204, the CPU 101 notifies the FPGA 102 of a reconfiguration instruction of the logic circuit.

In step S205, the CPU 101 waits for a wait signal 108 output from the FPGA 102 to be released (NO in step S205). If the wait signal 108 is released (YES in step S205), the CPU 101 terminates the boot processing. At this timing, a port setting in the CPU 101 may also be performed.

After the operations illustrated in FIGS. 5A and 5B are completed, the CPU 101 and the image data processing unit 304 of the FPGA 102 cooperate with each other to carry out various processing such as copying, printing, scanning, and faxing.

According to the first exemplary embodiment, in the image forming apparatus 1 that includes the CPU 101 and the FPGA 102, a ROM for the CPU 101 can be omitted. As a result, the cost of the components and the scale of the circuit can be reduced in the image forming apparatus 1.

According to a second exemplary embodiment, in an image forming apparatus that includes an FPGA, the FPGA functions as a ROM for a boot program and a processing circuit for image data both at and after startup.

The configuration of an image forming apparatus 1 is similar to that illustrated in FIG. 1, and thus the description thereof will be omitted.

In addition, the configuration of a controller unit 110 is similar to that illustrated in FIG. 2, and thus the description thereof will be omitted.

Figure 6:
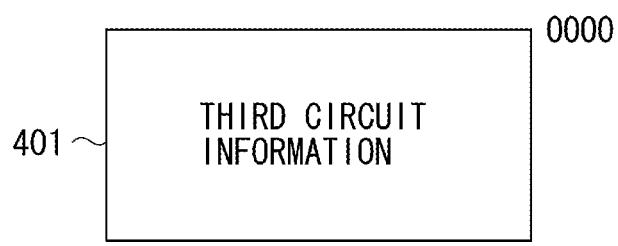
FIG. 6 is a diagram illustrating a data structure of a flash ROM according to a second exemplary embodiment of the present invention.

FIG. 6 is a diagram illustrating a data structure of a flash ROM 104 according to the present exemplary embodiment.

Figure 7:
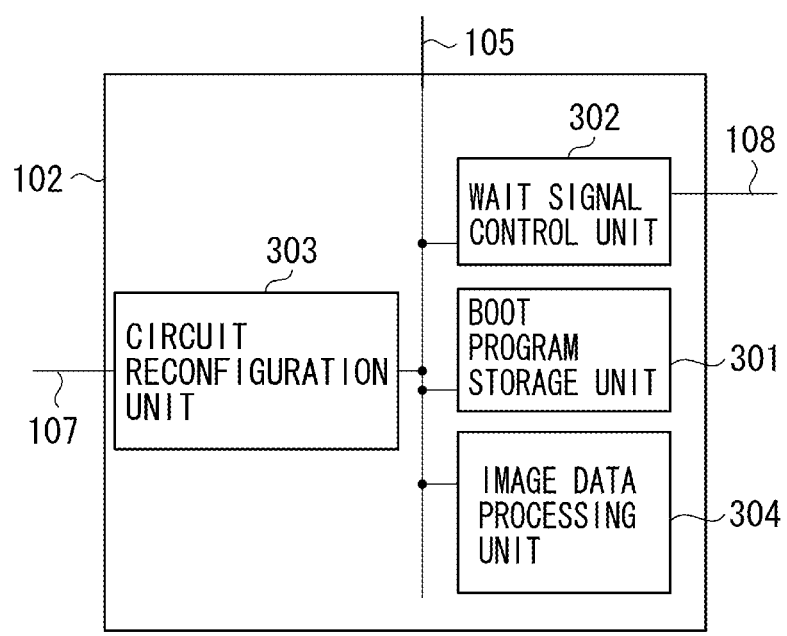
FIG. 7 is a diagram illustrating a logic circuit configured in an FPGA according to the second exemplary embodiment.

Third circuit information 401 is data for configuring, in the FPGA 102, a logic circuit illustrated in FIG. 7. The third circuit information 401 is written in the flash ROM 104 at an address "0000".

FIG. 7 is a diagram illustrating a logic circuit configured in the FPGA 102 according to the present exemplary embodiment.

FIG. 7 is a diagram illustrating a third logic circuit configured in the FPGA 102 by loading the third circuit information 401 into the FPGA 102. The logic circuit illustrated in FIG. 7 is configured in the FPGA 102 when the image forming apparatus 1 is started.

In FIG. 7, the circuit reconfiguration control unit 303 is a static configuration. That is, the circuit reconfiguration control unit 303 is fixed and cannot be modified by loading a program to be described later. On the other hand, components other than the circuit reconfiguration control unit 303 are dynamic configurations. That is, those components are not fixed in advance and can be modified by loading a program to be described later.

In FIG. 7, parts that are similar to those in FIGS. 4A and 4B are given the same reference numerals, and the descriptions thereof will be omitted. The configuration in FIG. 7 differs from those in FIGS. 4A and 4B in that the boot program storage unit 301 and the image data processing unit 304 are both provided in the same circuit.

FIGS. 8A and 8B are flowcharts illustrating operations of the controller unit 110 when the image forming apparatus 1 is started according to the present exemplary embodiment.

In FIGS. 8A and 8B, processes that are similar to those in FIGS. 5A and 5B are given the same reference numerals, and the descriptions thereof will be omitted. The operations illustrated in FIGS. 8A and 8B differ from those illustrated in FIGS. 5A and 5B in that step S101 is changed to step S301 and in that steps S103, S104, S105, S106, S204, and S205 are omitted.

The operation illustrated in FIG. 8A is realized by the FPGA 102 loading a program from the flash ROM 104 and executing the program. The operation in FIG. 8B is realized by the CPU 101 loading a program from the hard disk 8 or the FPGA 102, which is in the circuit configuration illustrated in FIG. 7, and executing the program.

In step S301, the FPGA 102 reads the third circuit information 401 from the flash ROM 104 at the address "0000" through the circuit reconfiguration control unit 303, and configures the third logic circuit as illustrated in FIG. 7.

After the operations illustrated in FIGS. 8A and 8B are completed, the CPU 101 and the image data processing unit 304 of the FPGA 102 cooperate with each other to carry out various processing such as copying, printing, scanning, and faxing.

According to the second exemplary embodiment, in the image forming apparatus 1 that includes the CPU 101 and the FPGA 102, a ROM for the CPU 101 may not need to be provided separately. As a result, the cost of the components and the scale of the circuit can be reduced in the image forming apparatus 1. Furthermore, in comparison with the first exemplary embodiment, although the scale of the logic circuit configured in the FPGA 102 at startup increases, processing of the FPGA 102 and the CPU 101 after startup can be simplified.

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2012-145659 filed Jun. 28, 2012, which is hereby incorporated by reference herein in its entirety.

What is claimed is:

1. An image processing apparatus, comprising:
   a CPU;
   a programmable logic device configured to read circuit information in order to implement, by a configuration according to the read circuit information, a logic circuit; and
   a memory, connected to the programmable logic device, storing first circuit information in a first location corresponding to a first address for causing the programmable logic device to implement a first logic circuit functioning as a storage medium storing a boot program to be executed by the CPU and second circuit information in a second location corresponding to a second address for causing the programmable logic device to implement a second logic circuit functioning as an image processing circuit,
   wherein the programmable logic device is configured to read the first circuit information from the first location of the memory based on the first address without an instruction by the CPU, in order to implement, by a first configuration according to the read first circuit information, the first logic circuit,
   wherein the CPU is configured to execute the boot program stored in the implemented first logic circuit, in order to transmit information on the second address to the programmable logic device; and
   wherein the programmable logic device is further configured to receive the transmitted information on the second address and read the second circuit information from the second location of the memory based on the second address, in order to implement, by a second configuration according to the read second circuit information, the second logic circuit.

2. The image processing apparatus according to claim 1, wherein the programmable logic device is further configured to release a wait signal to the CPU after the completion of the first configuration of the first logical circuit,
   wherein the CPU is further configured to read the boot program from the implemented first logical circuit according to the release of the wait signal, and to transmit a reconfiguration instruction including the information on the second address to the programmable logic device according to the execution of the read boot program, and
   wherein the programmable logic device is further configured to read the second circuit information according to the transmitted reconfiguration instruction.

3. The image processing apparatus according to claim 2, wherein the programmable logic device is further configured to assert the wait signal to the CPU before the second configuration of the second logic circuit and release the wait signal to the CPU after the completion of the second configuration of the second logical circuit.

4. The image processing apparatus according to claim 1, further comprising:
   an image forming unit configured to form an image based on image data that has been subjected to image processing by the second logic circuit functioning as the image processing circuit.

5. The image processing apparatus according to claim 1, wherein the programmable logic device is a field programmable gate array.

6. The image processing apparatus according to claim 1,
   wherein the first address is an address in the memory and the second address is an address in the memory,
   wherein the programmable logic device automatically reads, according to a start of the image processing apparatus, the first circuit information from the first location, and
   wherein the programmable logic device reads the second circuit information from the second location according to the received information on the second address.

7. A method for controlling an image processing apparatus that includes CPU, a programmable logic device configured to read circuit information in order to implement, by a configuration according to the read circuit information, a logic circuit, and a memory connected to the programmable logic device and storing first circuit information in a first location corresponding to a first address for causing the programmable logic device to implement a first logic circuit functioning as a storage medium storing a boot program to be executed by the CPU and second circuit information in a second location corresponding to a second address for causing the programmable logic device to implement a second logic circuit functioning as an image processing circuit, the method comprising:
   implementing, by the programmable logic device reading the first circuit information from the first location of the memory without an instruction by the CPU, the first logic circuit
   executing, by the CPU the boot program stored in the implemented first logic circuit, in order to transmit information on the second address to the programmable logic device; and
   implementing, by the programmable logic device receiving the transmitted information on the second address and reading the second circuit information from the second location of the memory based on the second address, the second logic circuit.

8. The method according to claim 7, wherein the programmable logic device is a field programmable gate array.

9. The method according to claim 7,
   wherein the first address is an address in the memory and the second address is an address in the memory,
   wherein, by the programmable logic device, the first circuit information is read from the first location automatically according to a start of the image processing apparatus, for the implementing of the first logic circuit, and
   wherein, by the programmable logic device, the second circuit information is read from the second location according to the received information on the second address.

* * * * *